United States Patent [19]
Liu et al.

[11] Patent Number: 5,780,339
[45] Date of Patent: Jul. 14, 1998

[54] METHOD FOR FABRICATING A SEMICONDUCTOR MEMORY CELL IN A DRAM

[75] Inventors: Bin Liu, Taipei; Wen-Jya Liang, Hsinchu; Yeh-Sen Lin, Tao Yuan, all of Taiwan

[73] Assignee: Vanguard International Semiconductor Corporation, Hsinchu, Taiwan

[21] Appl. No.: 850,908

[22] Filed: May 2, 1997

[51] Int. Cl.⁶ .................................................. H01L 21/8242
[52] U.S. Cl. ........................ 438/253; 438/595; 438/675
[58] Field of Search ................................ 438/253, 396, 438/595, 652, 675

[56] References Cited

U.S. PATENT DOCUMENTS

5,296,400  3/1994  Park et al. ............................ 438/253
5,332,685  7/1994  Park et al. ............................ 438/158
5,441,908  8/1995  Lee et al. ............................. 438/253
5,492,850  2/1996  Ryou .................................... 438/253

*Primary Examiner*—Chandra Chaudhari
*Attorney, Agent, or Firm*—Christensen, O'Connor, Johnson & Kindness PLLC

[57] ABSTRACT

This present invention is a method of fabricating a semiconductor memory cell in a DRAM. This invention utilizes a inter plug technique and nitride sidewall spacers to improve deep node contact etching damage and reduce the number of mask steps for typical landing pad processes. Thus, the method of this invention allows the manufacture of a semiconductor memory cell that reduces the difficulties due to the high aspect ratio of the contact hole of a storage node.

18 Claims, 6 Drawing Sheets

METHOD FOR FABRICATING A SEMICONDUCTOR MEMORY CELL IN A DRAM

FIELD OF THE INVENTION

The present invention relates to manufacture a semiconductor memory cell and, more particularly, to a method of forming contacts in a DRAM.

BACKGROUND OF THE INVENTION

Easy of manufacturing, low cost, and good performances are essential for a successful DRAM manufacturing operation. Conventional DRAM capacitor-over-bitline (COB) processes with deep node contact etching often will affect refresh time performance of the DRAM cell. This is because the distance from the capacitor node to the substrate is relatively long. In addition, the node contact hole has a high aspect ratio that is difficult to implement using photolithography and etching techniques. This difficulty may cause many defects. For example, the over-etching time becomes long because distance from the capacitor node to the substrate is long, thus resulting in possible reduction in the reliability. Therefore, the node contact holes with high aspect ratio are found to be challenging in contact hole etching.

In the past few years, a method of forming a contact plug has been proposed to reduce difficulties due to the high aspect ratio of contact holes in storage electrodes. See U.S. Pat. No. 5,332,685 entitled "Method of Manufacturing A DRAM Cell", to Park et al. Recently, Samsung Corp. had proposed using the concept of 'landing pad' which has greatly improved the art. See IEDM'94, p635, Kang et al., "Highly Manufacturable Process Technology for Reliable 256 Mbit and 1 Gbit DRAMs". However, this approach greatly increases the number of mask steps required for fabrication, thereby increasing process complexity. Thus, there is a need to find a simple process which can solve the deep contact etching problem.

SUMMARY OF THE INVENTION

In accordance with the present invention, a method of fabricating a semiconductor memory cell in a DRAM is disclosed. This invention provides a inter plug process to simply the manufacturing burden, but still maintaining the required performance. In one embodiment, the method comprises: forming isolation regions on a substrate; forming gate electrodes on the substrate and the isolation regions; forming first spacers on the sidewalls of the gate electrodes; forming source/drain regions in the surface of the substrate; forming a first dielectric layer on the source/drain regions and the gate electrodes; patterning and etching the first dielectric layer to expose a portion of the source/drain regions to form first contact holes; forming a first conductive layer on the first dielectric layer and in the first contact holes; removing the first conductive layer over the first dielectric layer to form inter plugs; forming a second dielectric layer on the first conductive layer and said first dielectric layer; patterning and etching the third dielectric layer, the second conductive layer, and the second dielectric layer until a portion of the first conductive layer is exposed to form a pre-third contact hole; forming second spacers on the sidewalls of the pre-third contact hole to form a third contact hole; forming a third conductive layer on the third dielectric layer and in the third contact hole; patterning and etching the third conductive layer to form a storage node of a capacitor; forming a capacitor insulating film over the storage node; forming a plate of the capacitor over the capacitor insulting film.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein: FIG. 1A to FIG. 6B schematically illustrate cross-sectional views of a structure formed at various stages in fabricating a semiconductor memory cell in accordance with the present invention.

DETAILED DESCRIPTION OF THE PREFERRED EMBODIMENT

A method of fabricating a semiconductor memory cell in a DRAM according to the present invention is described herein. FIG. 1A to FIG. 6B schematically illustrate cross-sectional views of the structure formed at various stages in fabricating a semiconductor memory cell in accordance with one embodiment of the present invention.

Figure 1A:
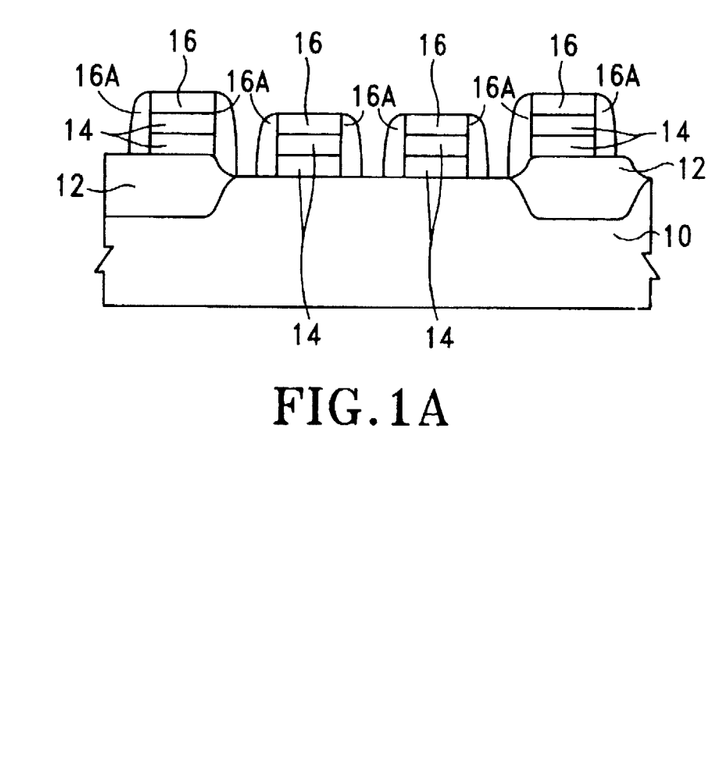
Figure 1B:
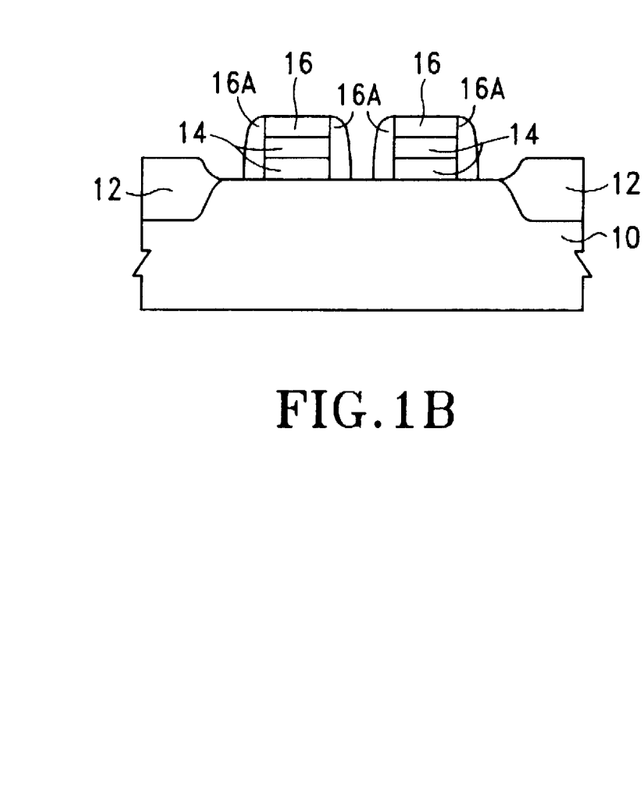

FIG. 1A shows cross-sectional views of the first stage of fabricating a semiconductor memory cell in the center circuit and FIG. 1B shows cross-sectional views of the first stage of fabricating a semiconductor memory cell in the peripheral circuit. A single crystal substrate 10 with a <100>crystallographic orientation is provided. Isolation regions are formed on the substrate 10. Isolation regions can be field oxide regions or shallow trench regions.

In this embodiment, thick field oxide (FOX) regions 12 are formed to provide isolation between devices on the substrate 10. The FOX regions 12 is created in a conventional manner. In this embodiment, the FOX regions 12 are formed via standard photolithography and dry etching steps to define the FOX regions 12 using a silicon nitride layer formed on the substrate. The exposed portions of the substrate are then subjected to thermal oxidation in an oxygen-steam environment to grow the FOX region 12 to a thickness of about 4000–6000 angstroms. The silicon nitride layer is then removed. Next, a silicon dioxide layer is created on the top of surface of the substrate 10 to serve as the gate oxide for subsequently formed metal oxide silicon field effect transistors. In this embodiment, the silicon dioxide layer is formed by using an oxygen-steam ambient, at a temperature of about 800–950° C. Alternatively, the oxide layer may be formed using any suitable oxide chemical compositions and procedures. In this embodiment, the silicon dioxide layer is formed to a thickness of approximately 80–150 angstroms.

A first polysilicon layer is then formed over the FOX regions 12 and the silicon dioxide layer using a low pressure chemical vapor deposition (LPCVD) process. The first polysilicon layer is doped in order to form a conductive gate for the MOSFET structure. In this embodiment, the first polysilicon layer has a thickness of about 500–2000 angstroms and is doped with phosphorus dopants at a concentration of about $10^{20}$–$10^{21}$ ions/cm$^3$. A tungsten silicide layer is formed on the first polysilicon layer to improve interconnection between the gate polysilicon and subsequently formed metal interconnects. The first polysilicon layer and the tungsten silicide layer are stacked to become a polycide layer 14.

A first dielectric layer 16 is then deposited using conventional manners. In this embodiment, the first dielectric layer 16 can be a silicon nitride layer or a silicon oxide layer. The thickness of first dielectric layer 16 is about 1000–2500 angstroms. Next, standard photolithography and etching process are performed to form gate structures 14 and 16. Sidewall spacers 16A are subsequently formed on the sidewalls of the gate structure 14 and 16. In this embodiment, the sidewall spacer 16A is composed of silicon nitride.

Figure 2A:
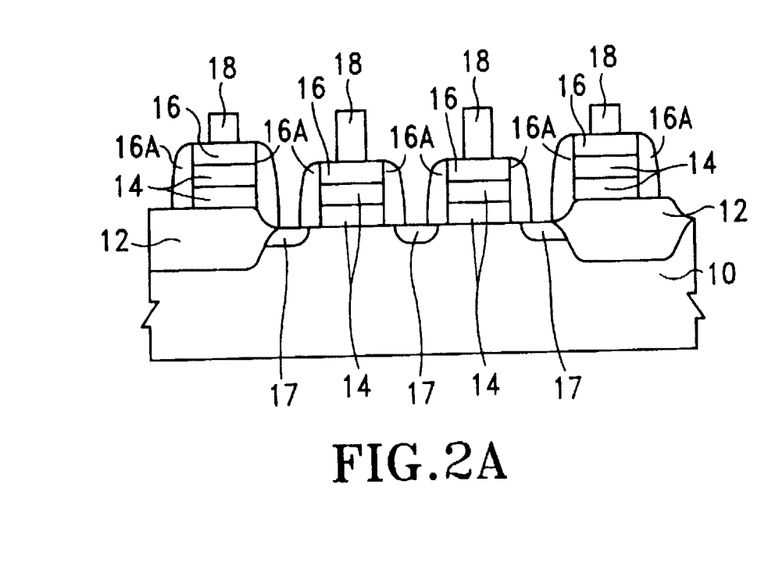
Figure 2B:
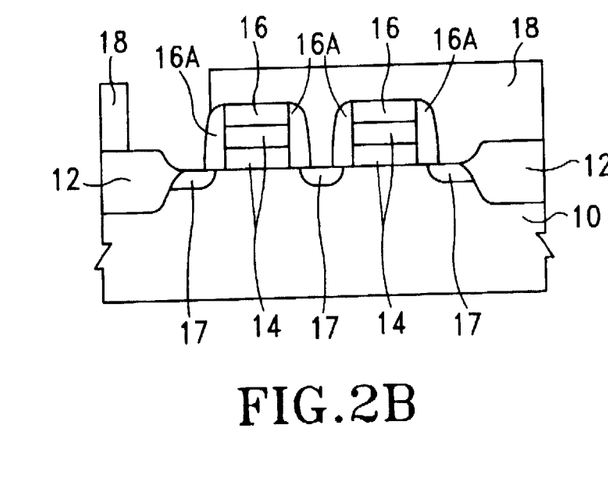

FIG. 2A shows the next stage of this invention in the center circuit and FIG. 2B shows the next stage of this invention in the peripheral circuit. Active regions 17 (i.e., MOSEFET's source and drain) are formed, using well-known processes to implant appropriate impurities in those regions and activate the impurities. In view of this disclosure, those skilled in the art of DRAM fabrication can modify this embodiment to form lightly doped drain (LDD) structures, without undue experimentation. Then a second dielectric layer 18 is deposited on the gate structures and the substrate 10 for isolation. The second dielectric layer 18, in the preferred embodiment, is composed of oxide such as TEOS formed using a standard chemical vapor deposition process to a thickness of about 1500–3000 angstroms.

Then, the second dielectric layer 18 is patterned and removed to expose a portion of source/drain regions in order to form first contact holes. In this embodiment, a standard photolithography process is performed to pattern the second dielectric layer 18. A two-step etching process is performed to removed the second dielectric layer 18. In this embodiment, a Self-aligned contact (SAC) etching is performed as the first step of the two-step etching process. The Self-aligned contact (SAC) etching is used to remove the second dielectric layer 18 to form the opening. In this embodiment, a selective etching process is performed to etch through the second dielectric layer 18 until the portion of source/drain regions exposed. The selective etching has a selectivity ratio of about 20:1 for oxide to nitride.

In this embodiment, an isotropic etching is performed as the second step of the two-step etching process. The isotropic etching is performed to physically enlarge the top opening region. In this embodiment, the isotropic etching is performed by any suitable etching process. For example, a wet etching is performed. The wet etching is performed using HF solutions. Alternatively, a plasma etching can be performed. The plasma etching process is performed using $CF_4$ gases. Thus, the first contact holes is formed as shown in FIG. 2A and 2B.

Figure 3A:
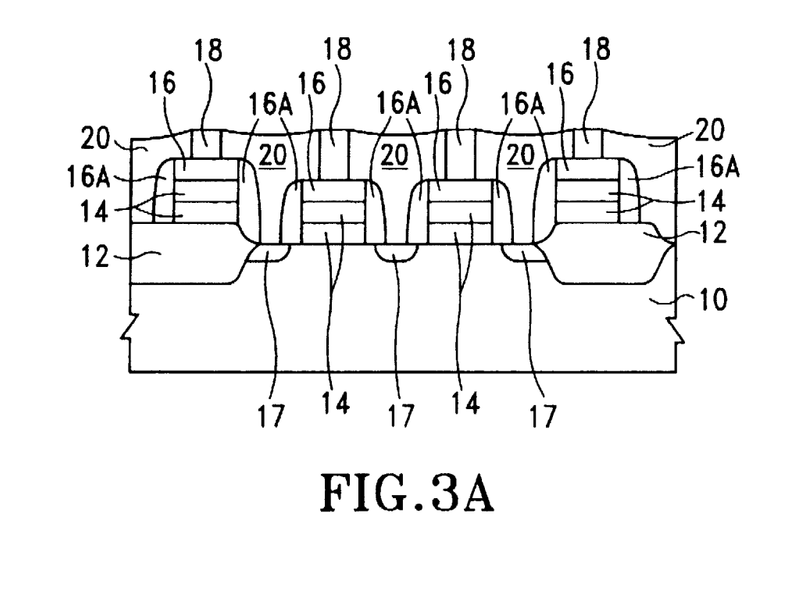
Figure 3B:
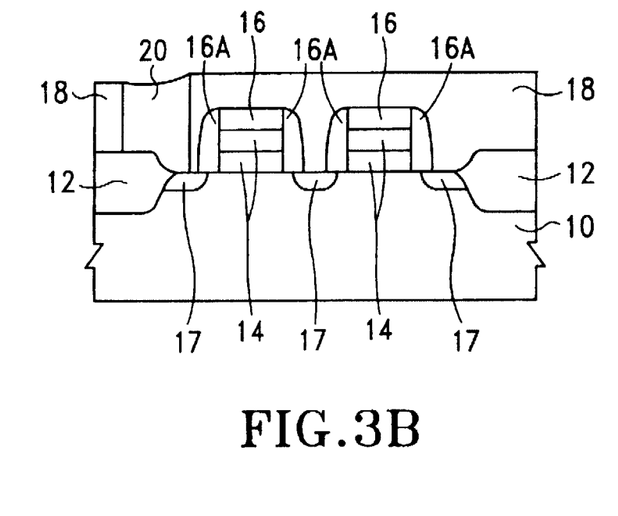

Referring to FIG. 3A and FIG. 3B, a second polysilicon layer is formed in the first contact holes and on the second dielectric layer 18. In this embodiment, the second polysilicon layer is performed using a low pressure chemical vapor deposition (LPCVD) process. The second polysilicon layer is doped in order to form conductive plugs for the MOSFET structure. In this embodiment, the second polysilicon layer has a thickness of about 2000–4000 angstroms and is doped with phosphorus dopants at a concentration of about $10^{17}$–$10^{18}$ ions/cm$^3$.

Next, the polysilicon layer over the second dielectric layer 18 is removed to form inter plugs 20. In this embodiment, a blanket polysilicon etchback process is performed in this step. The blanket polysilicon etchback process is performed using any suitable etching process. The blanket polysilicon etchback process can be performed using $CF_4$ gases. The inter plugs 20 serve to reduce the high aspect ratio of storage node contact. The resulting structure in the center circuit is shown in FIG. 3A and the resulting structure in the peripheral circuit is shown in FIG. 3B.

Figure 4A:
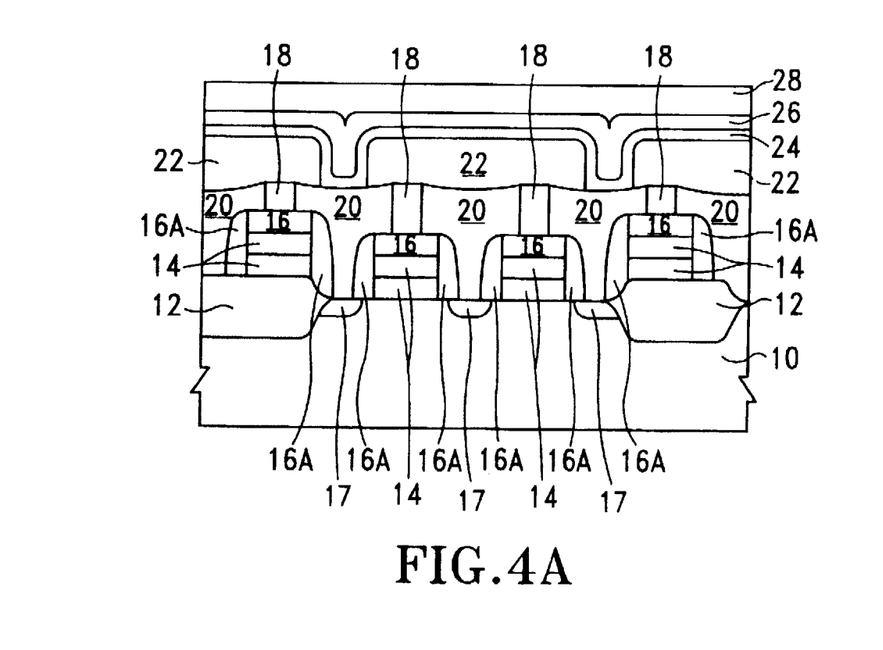
Figure 4B:
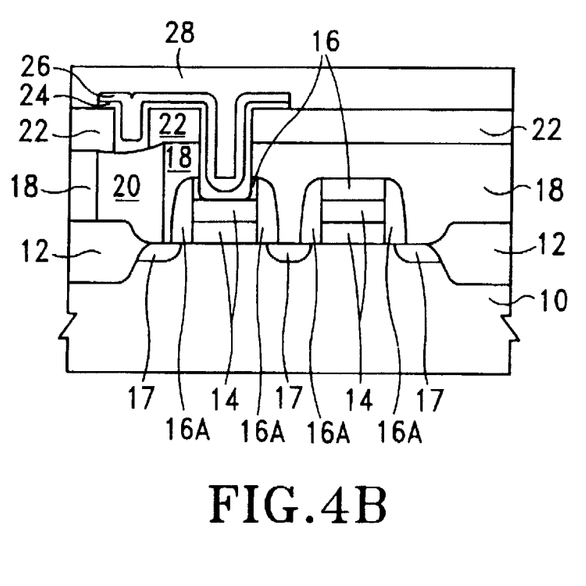

Next, turing to FIG. 4A and 4B, a third dielectric layer 22 is formed on the second dielectric layer 18 and the inter plugs 20. The third dielectric layer 22 is formed to isolate the plugs 20 and the bitline which will formed in the subsequent step. In this embodiment, the third dielectric layer 22 is composed of oxide such as BPSG deposited using a standard chemical vapor deposition process to a thickness of about 3500–8500 angstroms. Preferably, the third dielectric layer 22 is planarized to remain the third dielectric layer 22 over the second dielectric layer 18 about 1500–3000 angstroms thick. In this preferable embodiment, the planarization step can be performed using a chemical mechanical polish process (CMP) or an etching back process. The etching back process can be performed by any suitable process.

Then, the third dielectric layer 22 is patterned and removed to form second contact holes. In this embodiment, a standard photolithography process is performed to pattern the third dielectric layer 22. A reduced-contact etching (RCE) method is performed to remove the third dielectric layer 22. The reduced-contact etching method is applied to guarantee that the bitline will fall into inter plug regions 20 within stepper overlay specification. In this embodiment, the reduced-contact etching method is performed by oxide RCE, SiN RCE, poly RCE, or polymer RCE. Thus, the second contact holes are formed.

A third polysilicon layer 24 is comformally formed in the second contact holes and on the third dielectric layer 22. In this embodiment, the third polysilicon layer 24 is performed using a low pressure chemical vapor deposition (LPCVD) process. The third polysilicon layer is doped in order to form conductive plugs for the MOSFET structure. The third polysilicon layer is doped in order to form a conductive line for the MOSFET structure. In this embodiment, the third polysilicon layer has a thickness of about 500–2000 angstroms and is doped with phosphorus dopants at a concentration of about $10^{20}$–$10^{21}$ ions/cm$^3$. A second tungsten silicide layer 26 is formed on the third polysilicon layer and completely filled in the second contact holes to improve interconnection between the subsequently formed metal interconnects. The third polysilicon layer and the tungsten silicide layer are stacked to become a polycide layer as a bitline.

A fourth dielectric layer 28 is then formed on the second tungsten silicide layer 26. The fourth dielectric layer 28 is deposited to isolate bitline and storage electrode. In this embodiment, the fourth dielectric layer 28 can be formed of any suitable material. For example, the fourth dielectric layer 28 is composed of oxide such as BPSG deposited using a standard chemical vapor deposition process to a thickness of about 1000–3000 angstroms. The resulting structure in the center area is shown in FIG. 4A and the resulting structure in the peripheral area is shown in FIG. 4B.

Figure 5A:
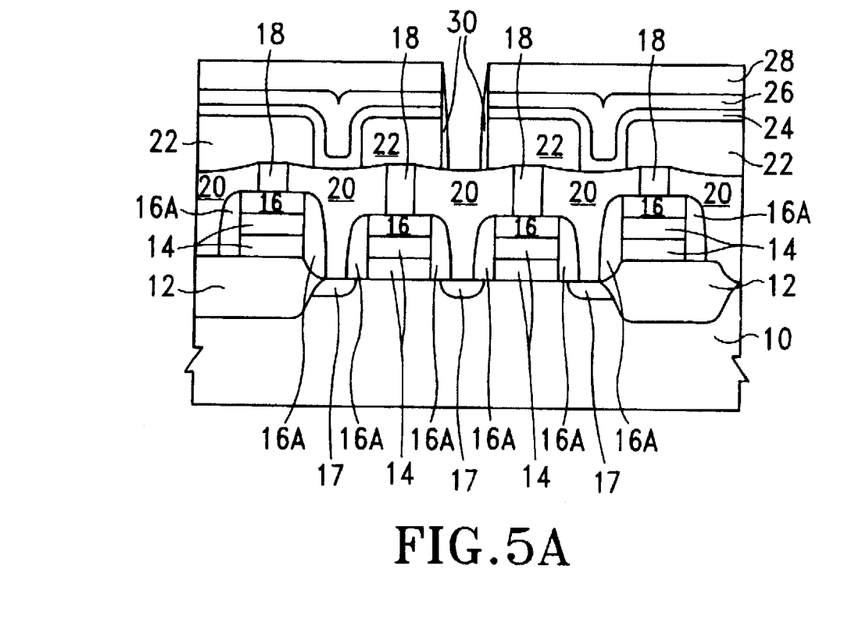
Figure 5B:
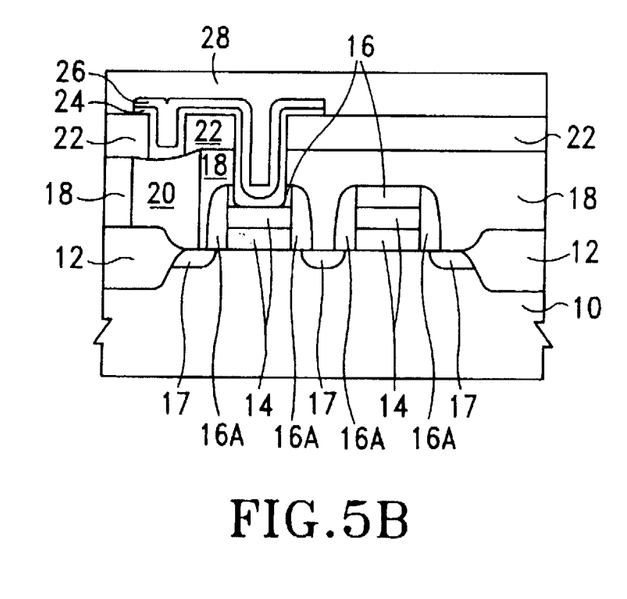

FIG. 5A shows the next stage of this invention in the center circuit and FIG. 5B shows the next stage of this invention in the peripheral circuit. The third dielectric layer 28, the third polysilicon layer 24, and the second tungsten silicide layer 26 are patterned and removed to form a pre-third contact. In this embodiment, a standard photolithography process is performed to pattern the third dielectric layer 28, the third polysilicon layer 24, and the second tungsten silicide layer 26. A reduced-contact etching (RCE) method is performed to remove through the third dielectric layer 28, the third polysilicon layer 24, and the second tungsten silicide layer 26. The reduced-contact etching method is applied to insure that node contact is within the inter plug regions. In this embodiment, the reduced-contact etching method is performed by oxide RCE, SiN RCE, poly RCE, or polymer RCE. Thus, the pre-third contact hole is formed.

Figure 6A:
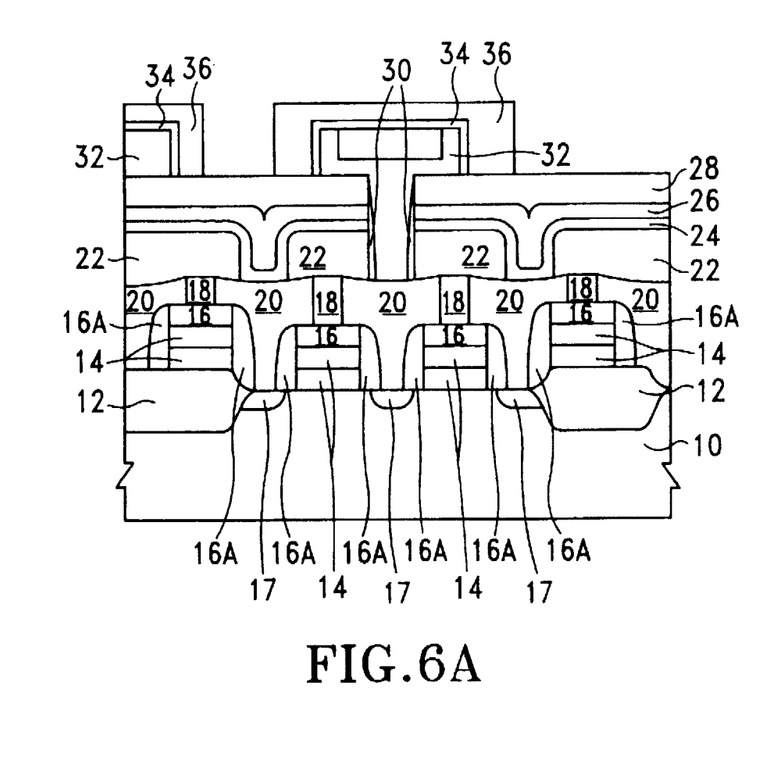
Figure 6B:
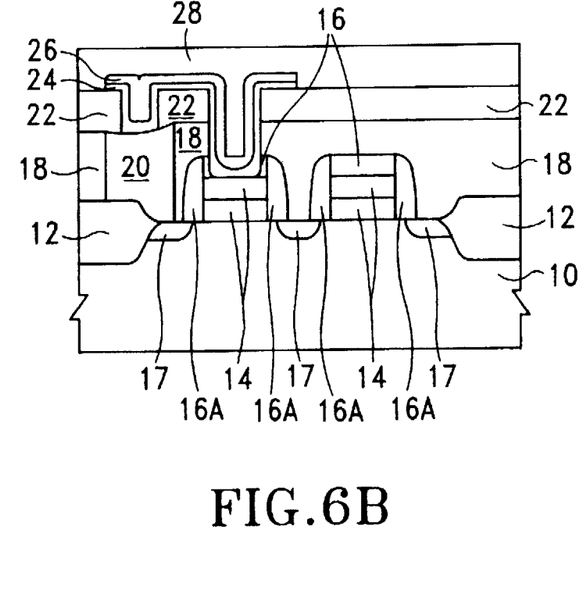

Then, spacers 30 is formed on the sidewalls of the pre-third contact to form a third contact as a node contact. In this embodiment, the spacers 30 can be formed of any suitable material. For example, the spacers 30 can be nitride spacers, polymer spacers, polysilicon spacers, or oxide spacers. In this embodiment, a thin nitride layer is comformally deposited on the third dielectric layer 28 and in the pre-third contact. Then, an etching process is performed to etchback the nitride layer to form nitride spacers. The spacers 30 will protect the separation of node contact and bitline from the wet dip etching process. Typically, the wet dip etching process is performed to clean the contact hole before the conductive material fills in the contact hole. The wet dip etching process is performed depending on the manufacturing processes required. The resulting structure is shown in FIG. 5A. FIG. 6A shows the final stage of this invention in the center circuit and FIG. 6B shows the final stage of this invention in the peripheral circuit. A fourth polysilicon layer 32 is then formed on the fourth dielectric layer 28 and in the contact hole. The third polysilicon layer 32 is formed using a conventional LPCVD process to completely fill the contact holes. The thickness of the fourth polysilicon layer 32 on the top surface of the fourth dielectric layer 34 is about 1500–10000 angstroms. The fourth polysilicon layer 36 doped with phosphorus dopants with a concentration of about $10^{20}$–$10^{21}$ ions/cm$^3$ to increase conductivity. Any suitable method may be used to doped the polysilicon such as, for example, in-situ doping. The capacitor is then completed by forming a capacitor dielectric (e.g. ONO) and upper storage node using any suitable conventional processes.

Next, a fifth dielectric layer 34 is deposited on the bottom storage node of the capacitor. Finally, a fifth polysilicon layer 36 is deposited on the fifth dielectric layer 34 to complete formation of the capacitor.

In this invention, the inter plugs solve the etching problems of the conventional deep node contact such as, for example, difficulty in opening a deep and small contact hole, extensive node substrate damage duo to deep contact etching, difficulty in adjusting junction depth and device performance and design refresh time requirement. In addition, the reduced-contact etching method is applied to protect the bitline from falling into inter plug region within stepper overlay specification. Thus, in this invention, the enlarged plug surface area is achieved to give manufacturing tolerance for process variations.

Although specific embodiment has been illustrated and described, it will be obvious to those skilled in the art that various modifications may be made without departing from the which is intended to be limited solely by the appended claims.

The embodiments of the invention in which an exclusive property or privilege is claimed are defined as follows:

1. A method for fabricating a semiconductor memory cell in a DRAM, said method comprising:

forming isolation regions on a substrate;

forming gate electrodes on said substrate and said isolation regions;

forming first spacers on the sidewalls of said gate electrodes;

forming source/drain regions in the surface of said substrate;

forming a first dielectric layer on said source/drain regions and said gate electrodes;

patterning and etching said first dielectric layer to expose a portion of said source/drain regions to form first contact holes;

forming a first conductive layer on said first dielectric layer and in said first contact holes;

removing said first conductive layer over said first dielectric layer to form inter plugs;

forming a second dielectric layer on said first conductive layer and said first dielectric layer;

patterning and etching said third dielectric layer, said second conductive layer, and said second dielectric layer until a portion of said first conductive layer is exposed to form a pre-third contact hole;

forming second spacers on the sidewalls of said pre-third contact hole to form a third contact hole;

forming a third conductive layer on said third dielectric layer and in said third contact hole;

patterning and etching said third conductive layer to form a storage node of a capacitor;

forming a capacitor insulating film over said storage node; and forming a plate of said capacitor over said capacitor insulting film.

2. The method according to claim 1, wherein said gate electrodes comprises a stack structure of polycide layer/silicon nitride layer.

3. The method according to claim 1, wherein forming said first spacers comprises:

depositing a silicon nitride layer on said gate electrodes and said substrate; and etching said silicon nitride layer to form silicon nitride spacers.

4. The method according to claim 1, wherein said first dielectric layer comprises an oxide layer having about 1000–2500 angstroms.

5. The method according to claim 1, wherein removing said first dielectric layer is a two step process comprising:

a selective etching, having a selectivity ratio of about 20:1 for oxide to silicon; and an isotropic etching.

6. The method according to claim 1, wherein said first conductive layer comprises a polysilicon layer of thickness about 500–2000 angstroms.

7. The method according to claim 1, wherein said second dielectric layer comprises an oxide layer of thickness about 1500–3000 angstroms.

8. The method according to claim 1, wherein removing said second dielectric layer comprises using a reduced-contact etching process.

9. The method according to claim 8, wherein said second conductive layer comprises a polycide layer of thickness about 2000–4000 angstroms.

10. The method according to claim 1, wherein said second conductive layer comprises a polycide layer of thickness about 2000–4000 angstroms.

11. The method according to claim 1, wherein said second spacer is formed of a material selected from a group consisting of polysilicon, silicon nitride, oxide, and polymer.

12. The method according to claim 1, wherein said capacitor insulating film comprises a stack structure of oxide layer/nitride layer/oxide layer.

13. The method according to claim 1, wherein said plate is formed of polysilicon.

14. A method for fabricating a semiconductor memory cell in a DRAM, said method comprising:

forming isolation regions on a substrate;

forming gate electrodes on said substrate and said isolation regions;

forming first spacers on the sidewalls of said gate substrate;

forming source/drain regions in the surface of said substrate;

forming a first dielectric layer on said source/drain regions and said gate electrodes;

forming first contact holes in said first dielectric layer;

forming a first conductive layer on said first dielectric layer and in said first contact holes;

etching said first conductive layer over said first dielectric layer to form plugs, wherein said first dielectric layer serves as an end-stop etching point;

forming a second dielectric layer on said first conductive layer and said first dielectric layer;

forming second contact holes in said second dielectric layer;

forming a second conductive layer on said second dielectric layer and in said second contacts holes to form bitlines;

forming a third dielectric layer on said second conductive layer;

forming a pre-third contact hole through said third dielectric layer, said second conductive layer, and said second dielectric layer until a portion of said first conductive layer is exposed;

forming second spacers on the saidwalls of said pre-third contact hole to form a third contact hole;

forming a capacitor over said third dielectric layer, wherein said storage node connects a portion of said first conductive layer through said third contact hole.

15. The method according to claim 14, wherein said gate electrodes comprises a stack structure of polycide layer/ silicon nitride layer.

16. The method according to claim 14, wherein said first spacers is formed of silicon nitride.

17. The method according to claim 14, wherein said removing said first dielectric layer is a two step process comprising:

a selective etching, having a selectivity ratio of about 20:1 for oxide to silicon; and an isotropic etching.

18. The method according to claim 14, wherein said second spacer is formed of a material selected from a group consisting of polysilicon, silicon nitride, oxide, and polymer.

* * * * *